(12) United States Patent
Hiraki (10) Patent No.: US 8,122,595 B2
(45) Date of Patent: Feb. 28, 2012

(54) ELECTRONIC PARTS MOUNTING DEVICE

(75) Inventor: Tsutomu Hiraki, Yamanashi (JP)

(73) Assignee: Panasonic Corporation, Osaka (JP)

( * ) Notice: Subject to any disclaimer, the term of this patent is extended or adjusted under 35 U.S.C. 154(b) by 5 days.

(21) Appl. No.: 12/720,116

(22) Filed: Mar. 9, 2010

(65) Prior Publication Data

US 2010/0242268 A1 Sep. 30, 2010

(30) Foreign Application Priority Data

Mar. 25, 2009 (JP) .................. P2009-073294

(51) Int. Cl.
*H05K 3/30* (2006.01)

(52) U.S. Cl. ............... 29/832; 29/825; 29/840; 29/846

(58) Field of Classification Search ............. 29/825, 29/832, 840, 846

See application file for complete search history.

(56) References Cited

U.S. PATENT DOCUMENTS

| 4,998,342 A * | 3/1991 | Bonnell et al. ............... 29/840 |
| 7,793,817 B2 * | 9/2010 | Okamoto et al. ............. 228/102 |
| 7,870,991 B2 * | 1/2011 | Okamoto et al. ............. 228/103 |

FOREIGN PATENT DOCUMENTS

| JP | 2001-137756 A | 5/2001 |
| JP | 2002-028568 A | 1/2002 |
| WO | 2008/032755 A1 * | 3/2008 |

* cited by examiner

*Primary Examiner* — Carl Arbes (74) *Attorney, Agent, or Firm* — Pearne & Gordon LLP (57) ABSTRACT

A paste supply unit that is located in a side opposed to an electronic parts supply table 6 with a mounting table 8 sandwiched between them to supply a paste to a board 24 includes a transfer head 5 that transfers the paste to the board 24 and an dispense head 4 that draws an image by discharging the paste to the board 24, and either the transfer head 5 or the dispense head 4 is selected to supply the paste depending on the kind of an electronic parts.

3 Claims, 11 Drawing Sheets

ELECTRONIC PARTS MOUNTING DEVICE

BACKGROUND

1. Field of the Invention

The present invention relates to an electronic parts mounting device that mounts electronic parts on a board to which a paste adhesive material for bonding the electronic parts is transferred or drawn.

2. Description of the Related Art

In mounting electronic parts, there is a mounting method in which a paste type bonding agent is supplied to a board immediately before the electronic parts is mounted on the board and the electronic parts is mounted on the paste. In order to supply the paste to the board, is proposed a method (see patent literature 1) for drawing a prescribed form with the paste by using a syringe or a method (see patent literature 2) for transferring the paste by using a transfer pin having a prescribed form.

By discharging the paste from a nozzle hole provided in the syringe, the form drawing method is carried out. Thus, this method is advantageous for supplying a rapidly dry paste, however, it is not suitable for supplying a small amount of paste and is frequently used for mounting relatively large electronic part. As compared therewith, since a transfer method is suitable for supplying the small amount of paste, this method is widely used for supplying a slowly dry paste or mounting micro electronic parts.

Patent literature 1: JP-A-2001-137756
Patent literature 2: JP-A-2002-28568

In recent years, electronic parts are demanded to be more micronized and have higher functions. Thus, opportunities are increased that various kinds of and diverse electronic parts are densely mounted in one board. At this time, according to the transfer method, the electronic parts of various kinds and small or large sizes may be mounted, however, the form of the paste supplied to the board is restricted by the form of a previously prepared transfer pin. As compared therewith, in the form drawing method for moving the syringe to discharge the paste, the form of the paste is high in degree of freedom and the paste can be supplied to the electronic parts having different sizes with respectively optimum forms. However, in order to obtain a prescribed amount of application, a space between the surface of the board and the nozzle needs to be managed. When the board has a curvature, a complicated control is necessary.

SUMMARY OF THE INVENTION

It is an object of the present invention to provide an electronic parts mounting device that can properly use two types of paste supply methods including a transfer method and a form drawing method depending on circumstances.

An electronic parts mounting device define in a first aspect of the invention includes: an electronic parts accommodating part that accommodates a plurality of electronic parts; a board support part that supports a board; a paste supply unit that is located in a side opposed to an electronic parts supply part with the board support part sandwiched between them to supply a paste type bonding agent to the board; and a moving head that moves the electronic parts to the board to which the paste is supplied. The paste supply unit includes a paste storing part that stores the paste, a transfer head that transfers the paste from the paste storing part to the board and an dispense head that draws an image by discharging the paste to the board, and either the transfer head or the dispense head is selected to supply the paste depending on the kind of the electronic parts or a curvature occurred in the board.

In an electronic parts mounting device defined in a second aspect of the invention, when a curvature exceeding a predetermined allowable value occurs in the board, the transfer head is selected irrespective of the kind of the electronic parts to be mounted to supply the paste.

Since the present invention includes, as a unit that supplies a paste adhesive material for bonding the electronic parts to the board, the transfer head that transfers the paste adhesive material to the board and the dispense head that draws an image by discharging the paste adhesive material to the board, and either the transfer head or the dispense head is selected depending on the kind of the electronic parts to be mounted, the paste adhesive material can be supplied in a more suitable form for the electronic parts as an object to be mounted.

BRIEF DESCRIPTION OF THE DRAWINGS

FIGS. 2 (a), (b), (c) and (d) are explanatory views of a form of a paste adhesive material in the exemplary embodiment of the present invention.

DESCRIPTION OF THE PREFERRED EMBODIMENTS

Figure 1:
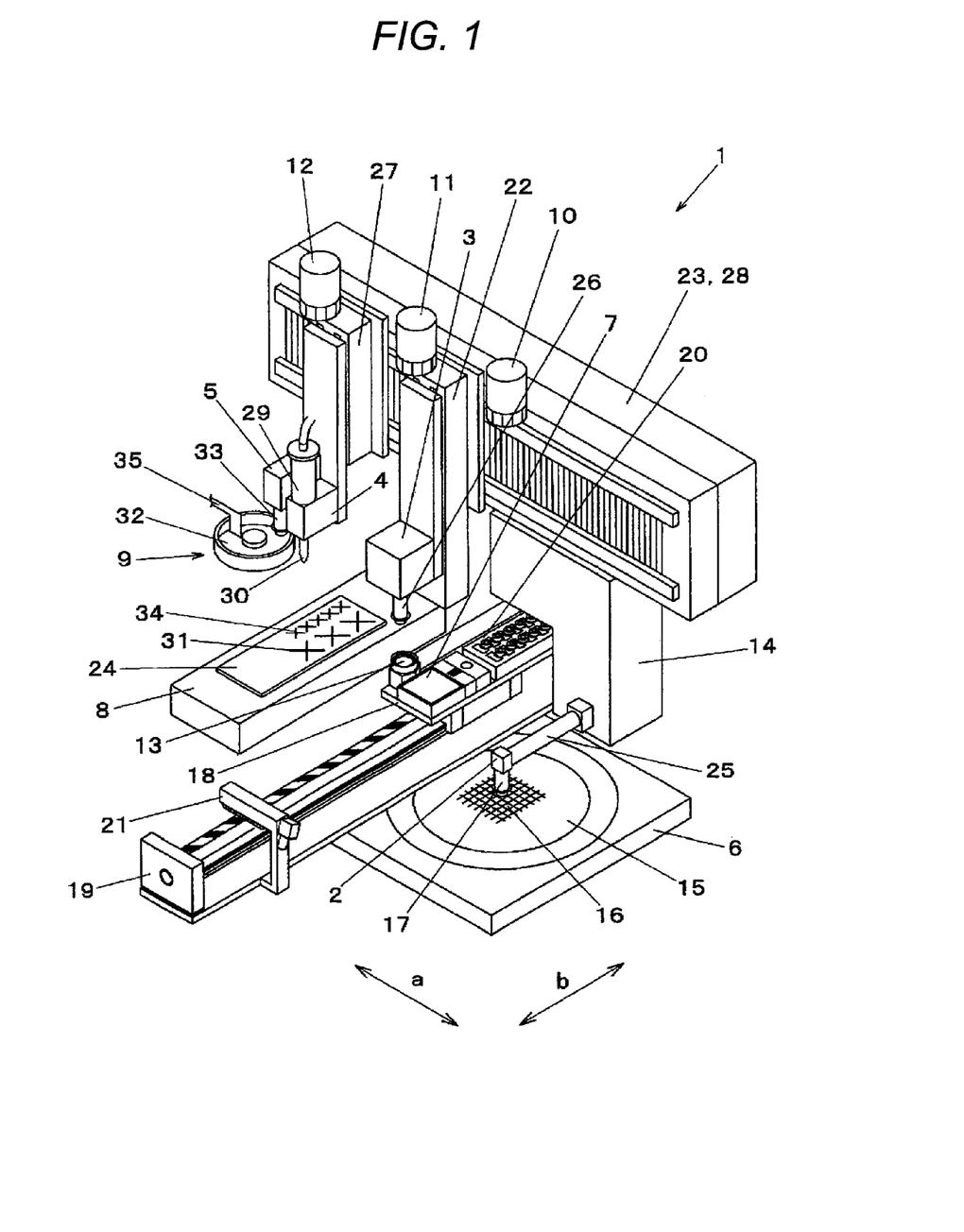
FIG. 1 is a structural diagram of an electronic parts mounting device in an exemplary embodiment of the present invention.
Figure 2:
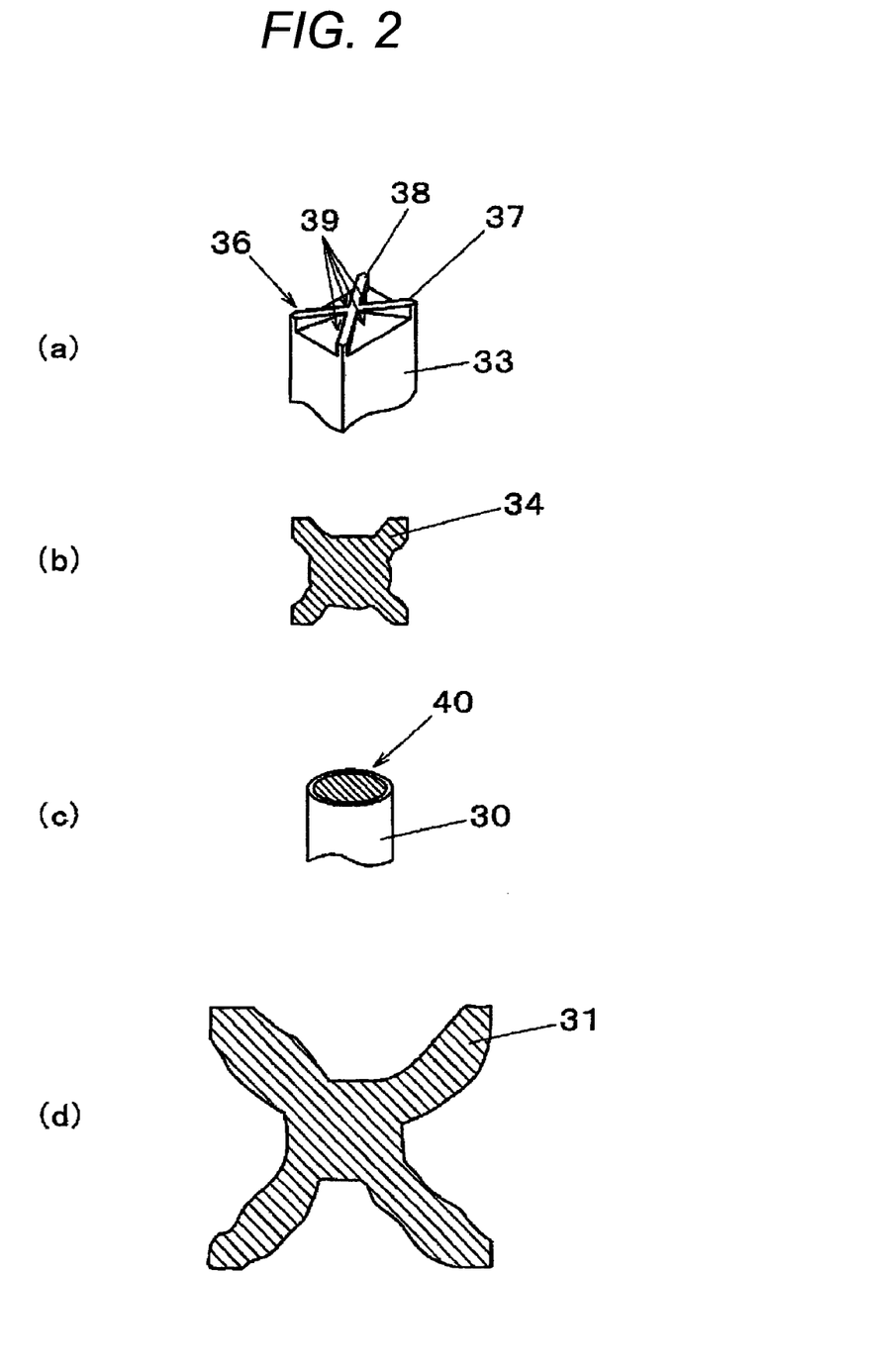

Now, an exemplary embodiment of the present invention will be described below by referring to the drawings. FIG. 1 is a structural diagram of an electronic parts mounting device in the exemplary embodiment of the present invention. FIGS. 2 (a), (b), (c), and (d) are explanatory views of a form of a paste adhesive material in the exemplary embodiment of the present invention. FIGS. 3 to 11 are explanatory views of mounting operations of the electronic parts mounting device in the exemplary embodiment of the present invention.

As shown in FIG. 1, the electronic parts mounting device 1 includes, as main parts, four operating heads having a pick-up head 2, a bonding head 3, an dispense head 4 and a transfer head 5, four operating tables having a parts supply table 6, a parts relay table 7, a mounting table 8 and a paste supply table 9 and four cameras 10, 11, 12 and 13. The operating tables are arranged in order of the parts supply table 6, the parts relay table 7, the mounting table 8 and the paste supply table 9 from a front surface side to the direction of the interior of the electronic parts mounting device 1.

The pick-up head 2 can move in the vertical direction and in the direction of the interior (an arrow mark a: a direction orthogonal to a conveying direction (an arrow mark b) of a board 24) by a pick-up head moving device 14, moves between the parts supply table 6 and the parts relay table 7 which are adjacent to each other to pick up a chip 16 stuck to a wafer sheet 15 and mounts the chip 16 on the parts relay table 7. The position or the orientation of the chip 16 stuck to the wafer sheet 15 is recognized before the chip 16 is picked up by analyzing a picked-up image by the camera 10 provided in an upper part in the vertical direction. When a displacement is recognized, the parts supply table 6 is moved to correct the position of the chip 16 and correct an angle of a pick-up nozzle 17 in accordance with the orientation of the chip 16.

The parts relay table 7 is mounted on an upper part of a moving table 18. The moving table 18 can move in the board conveying direction (the arrow mark b) by a direct-acting device 19. On the moving table 18, a nozzle stocker 20 or the camera 13 is arranged as well as the parts relay table 7. In a moving path of the moving table 18, a cleaning head 21 is arranged. When the moving table 18 passes below the cleaning head 21, an upper surface (a chip mounting surface) of the parts relay table 7 is cleaned or an unnecessary chip is removed.

The bonding head 3 is movable in the vertical direction and in the direction of the interior (the arrow mark a) of the electronic parts mounting device 1 by bonding head moving devices 22 and 23 and moves between the parts relay table 7 and the mounting table 8 which are adjacent to each other to pick up the chip 16 mounted on the parts relay table 7 and mount the chip 16 on a board 24. The board 24 is carried to the electronic parts mounting device 1 by a board conveying device not shown in the drawing and fixed to an upper part of the mounting table 8. The bonding head 3 not only may pick up the chip 16 from the parts relay table 7, but also may move to the parts supply table 6 to directly pick up the chip 16 from the wafer sheet 15 or receive the chip 16 from the pick-up head 2 inverted up and down on an end of an arm 25. In this case, a flip chip mounting is carried out in which an up and down inverted chip 16 is mounted on the board 24 in accordance with the inversion of the pick-up head 2.

The position or the orientation of the chip 16 mounted on the parts relay table 7 is recognized before the chip 16 is picked up by analyzing a picked-up image by the camera 11 provided in an upper part in the vertical direction. When a displacement is recognized, a positional relation between a bonding nozzle 26 and the chip 16 is corrected by the movement (the arrow mark a) of the bonding head 3 and the movement (the arrow mark b) of the parts relay table 7 to correct an angle of the bonding nozzle 26 in accordance with the orientation of the chip 16. Further, the image of the position or the orientation of the chip 16 picked up by the bonding head 3 may be picked up by the camera 13 arranged in the moving table 18 from a lower part in the vertical direction and recognized and corrected before the chip 16 is mounted on the board 24.

The dispense head 4 is movable in the vertical direction and in the direction of the interior (the arrow mark a) of the electronic parts mounting device 1 by image drawing and transfer head moving devices 27 and 28. The dispense head 4 pressurizes a paste adhesive material stored inside a syringe 29 to discharge the paste adhesive material from a discharge nozzle 30 in a lower end and supply the paste adhesive material to the board 24. The relative position of the discharge nozzle 30 to the board 24 is changed by the movement (the arrow mark a) of the dispense head 4 and the movement (the arrow mark b) of the board 24, so that the paste adhesive material can be drawn on the board 24 with a prescribed form 31.

The transfer head 5 is movable in the vertical direction and in the direction of the interior (the arrow mark a) of the electronic parts mounting device 1 by the image drawing and transfer head moving devices 27 and 28. The paste supply table 9 is a paste supply part that supplies the paste adhesive material to the transfer head 5. In the paste supply table 9, the paste adhesive material 32 is stored. The transfer head 5 immerses a transfer pin 33 at a lower end in the paste adhesive material 32, and then presses the transfer pin 33 to the board 24 to transfer a small amount of paste adhesive material adhering to the transfer pin 33 to the board 24 with a form 34 on a transfer surface. An amount of transferred paste adhesive material is adjusted by adjusting the depth of the paste adhesive material of a part of the transfer pin 33 that is immersed in the paste adhesive material by an adjusting plate 35 or adjusting the depth of the transfer pin 33 to be immersed in the paste adhesive material.

The form 31 of the paste adhesive material drawn on the board 24 and the form 34 of the similarly transferred paste adhesive material are recognized by analyzing an picked-up image by the camera 12 arranged in an upper part in the vertical direction of the mounting table 8. The camera 12 is also used to recognize the position or the orientation of the chip 16 mounted on the paste adhesive material.

The form of the paste adhesive material drawn or transferred by the dispense head 4 or the transfer head 5 will be described below by referring to FIGS. 2(a), (b), (c), and (d). A transfer surface 36 at the end of the transfer pin 33 is marked in the shape of X as shown in FIG. 2(a). The form 34 of the paste adhesive material transferred to the board by using the transfer pin 33 is shown in FIG. 2(b). Since the part of the shape of X is pressed to the board, a transferred form has a width larger than an actual width. Then, a large amount of paste adhesive material adheres to parts 39 at which two straight lines 37 and 38 intersect, an amount of transferred paste adhesive material is also increased.

At the end of the discharge nozzle 30, a small hole 40 is formed as shown in FIG. 2(c), the paste adhesive material having the same sectional area as the area of the hole 40 is discharged in the shape of a belt from the hole 40. Since the diameter of the hole 40 cannot be reduced to a necessary degree or more in view of the prevention of a clogging state, as shown in FIG. 2(d), an amount of the drawn paste adhesive material 32 is more than that of the transferred paste adhesive material shown in FIG. 2(b). Accordingly, the dispense head 4 is not occasionally used for mounting a micro chip that requires only an extremely small amount of paste adhesive material, and is frequently used for mounting a relatively large chip. Further, when an image or form is drawn, a space between the surface of the board and the discharge nozzle 30 needs to be managed to obtain a prescribed amount of application. When a curvature exists in the board, a complicated control is necessary.

On the contrary, since the transfer head 5 is excellent in the supply of a small amount of paste adhesive material, the transfer head 5 is frequently employed for mounting microchips. Further, since the transfer head 5 presses the transfer pin 33 to the board 24 to level flat even a part that is curved upward on the board 24, the transfer head 5 can advantageously transfer the paste adhesive material to a more precise position. Accordingly, the electronic parts mounting device 1 preferentially uses the transfer head 5 to the micro chips. When an outstanding curvature does not exist in the board 24, the dispense head 4 is used to other chips than the micro chips. To an outstanding part that is curved upward, the transfer head 5 whose transfer pin 33 is replaced by a transfer pin meeting the size of the chip is desirably used.

When the dispense head 4 and the transfer head 5 are selected, a control system of the electronic parts mounting device 1 automatically selects either the dispense head 4 or the transfer head 5 in accordance with parameters previously set for the size of the chip 16 or a degree of the curvature of the board 24 and data related to the size of the chip or data related to the curvature of the board.

Figure 3:
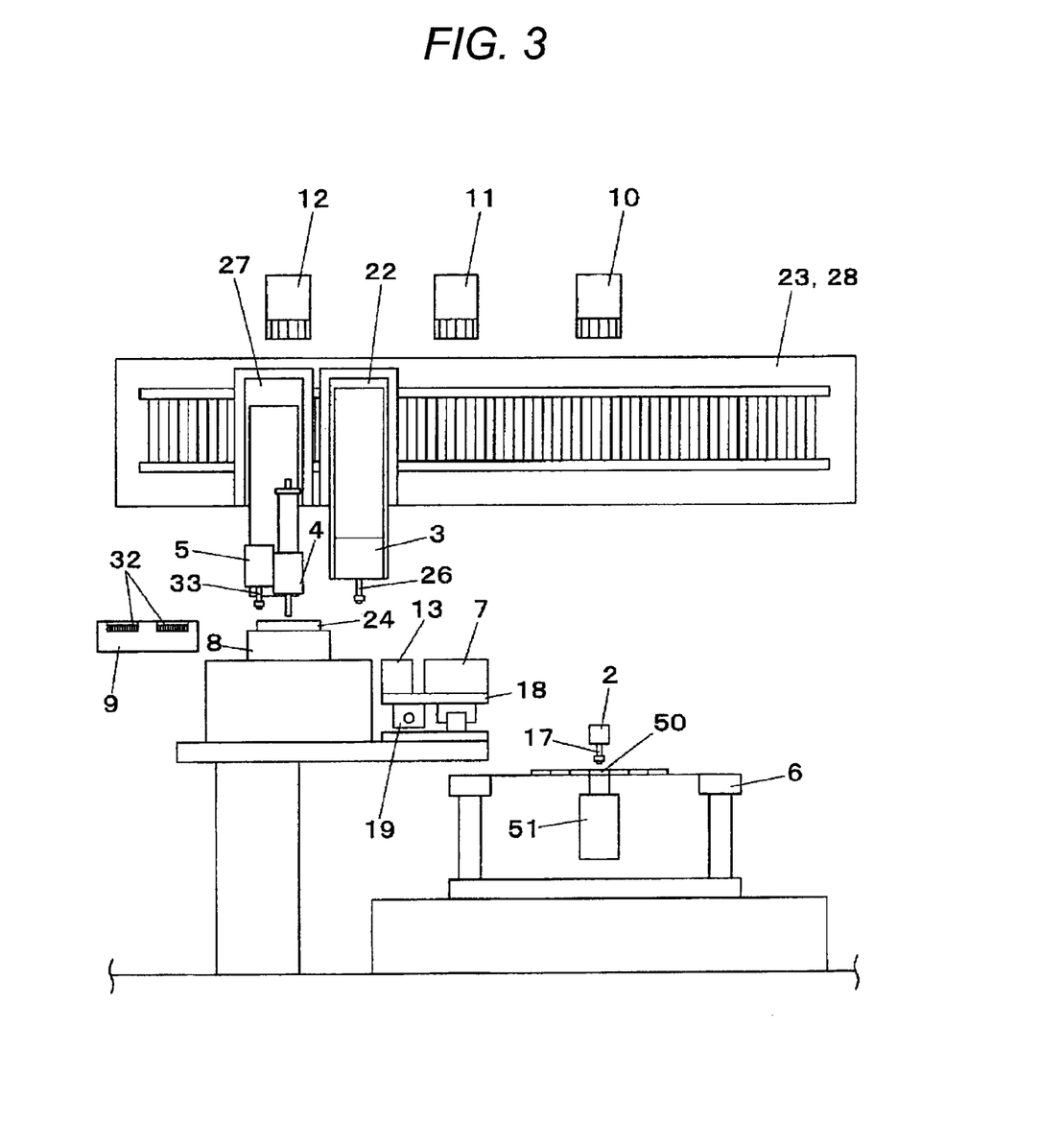
FIG. 3 is an explanatory view of a mounting operation of the electronic parts mounting device in the exemplary embodiment of the present invention.

Now, a chip mounting operation in the electronic parts mounting device 1 will be described below by referring to FIGS. 3 to 11. In FIG. 3, a chip 50 is held on the parts supply table 6. The pick-up nozzle 17 of the pick-up head 2 and the bonding nozzle 26 of the bonding head 3 are attached which meet the kind of the chip 50. In the nozzle stocker 20, the pick-up nozzles 17 or the bonding nozzles 26 meeting the kinds of various chips are stored. When the kind of the chip on the parts supply table 6 is changed, the pick-up head 2 or the bonding head 3 moves to the position of the nozzle stocker 20 to attach a nozzle meeting the kind of the chip thereto. Paste supply methods are allowed to meet the kinds of the chips as well as the kinds of the nozzles. Here, since the chip 50 as an object is not a micro-chip, the dispense head 4 is used to supply the paste adhesive material to the board 24.

Figure 4:
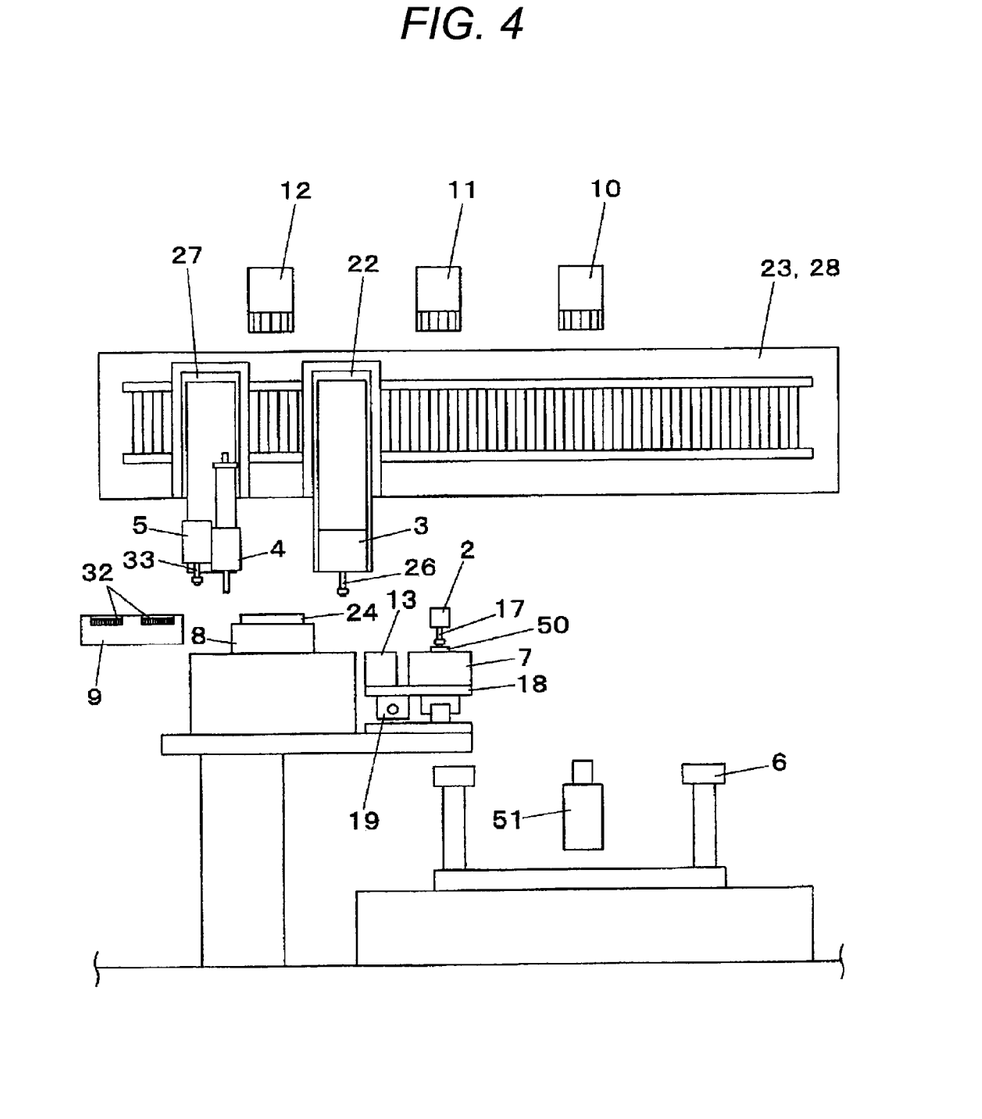
FIG. 4 is an explanatory view of a mounting operation of the electronic parts mounting device in the exemplary embodiment of the present invention.

In FIG. 4, the pick-up head 2 carries the chip 50 adsorbed by receiving the assist of an ejector 51 to the parts relay table 7. The dispense head 4 that finishes an image drawing operation retreats to a side part of the board 24 to provide an area for a bonding operation by the bonding heads 3. The chip 50 is detached from the parts supply table 6 together with the wafer sheet 15 to exchange for another kind of chip.

Figure 5:
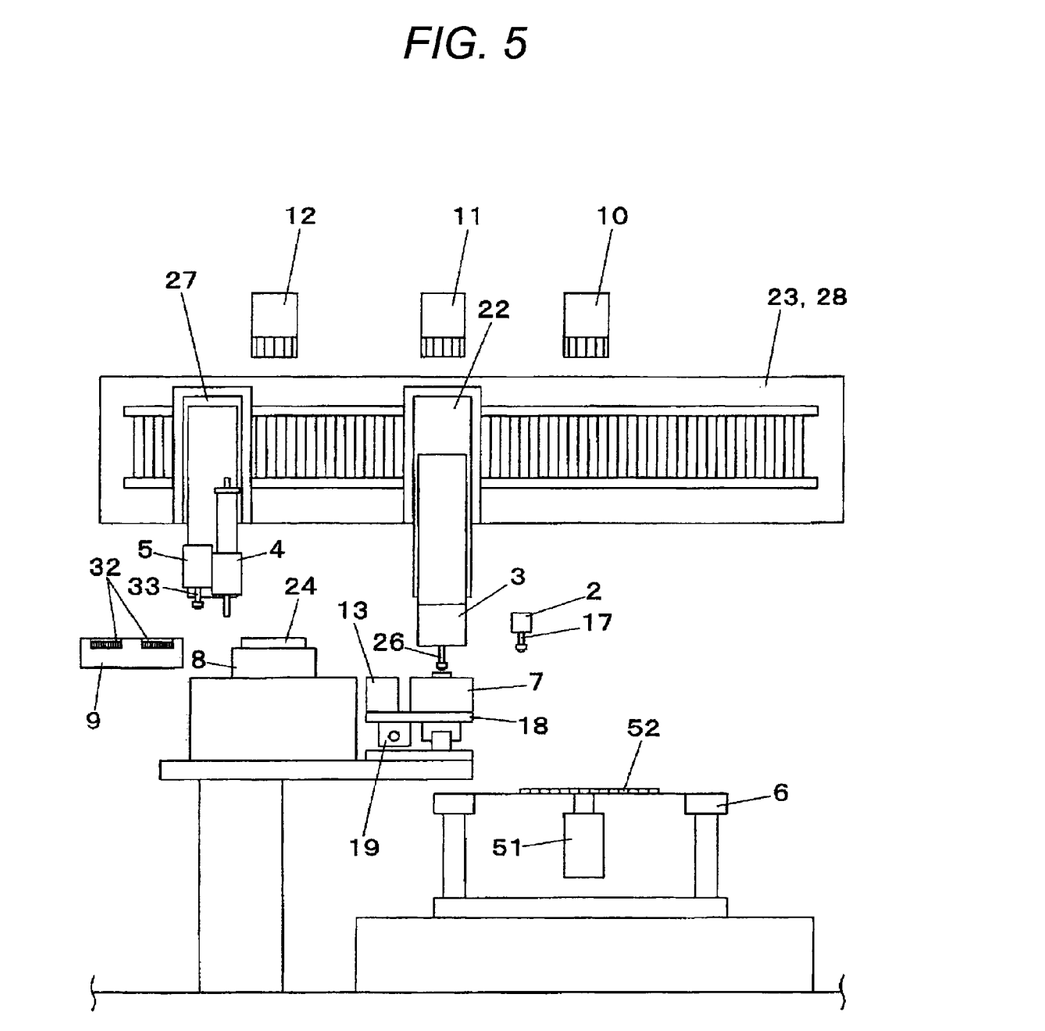
FIG. 5 is an explanatory view of a mounting operation of the electronic parts mounting device in the exemplary embodiment of the present invention.

In FIG. 5, the pick-up head 2 that finishes an operation retreats to a side part of the parts relay table 7 and the bonding head 3 adsorbs the chip 50 mounted on the parts relay table 7. During that time, in the parts supply table 6, a microchip 52 is prepared in place of the chip 50.

Figure 6:
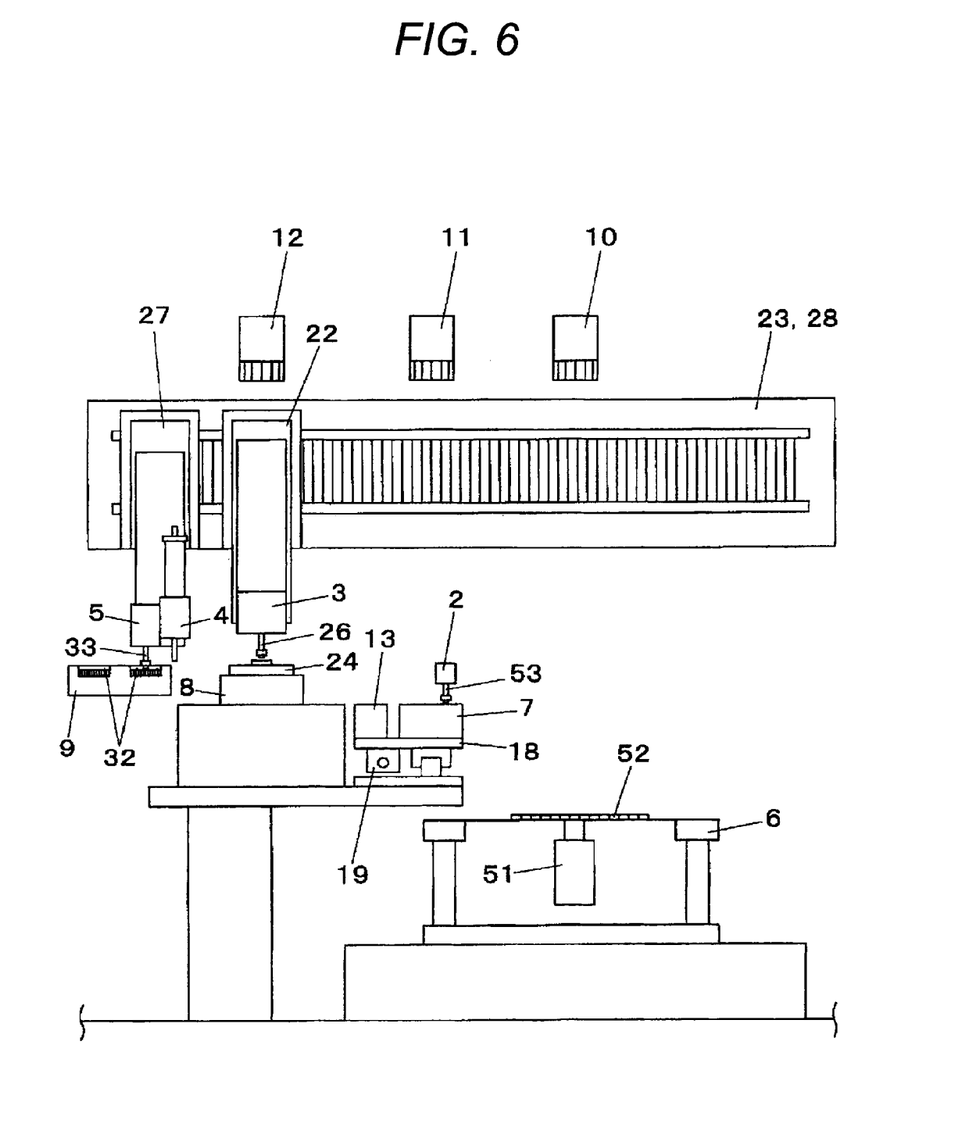
FIG. 6 is an explanatory view of a mounting operation of the electronic parts mounting device in the exemplary embodiment of the present invention.

In FIG. 6, the bonding head 3 mounts the chip 50 on the board 24. In a part on which the chip 50 is mounted, the paste adhesive material is drawn in a prescribed form in advance and the chip 50 is mounted thereon. During that time, the pick-up head 2 and the transfer head 5 prepare for next operations. The pick-up head 2 replaces the pick-up nozzle 17 by a pick-up nozzle 53 for the micro chip 52 to be picked up next. The pick-up nozzle 53 is previously stored in the nozzle stocker 20. On the other hand, in the transfer head 5, a position in the direction of height is changed so as to be relatively located at a lower position than the dispense head 4, and the transfer pin 33 is immersed in the paste adhesive material stored in the paste supply table 9.

Figure 7:
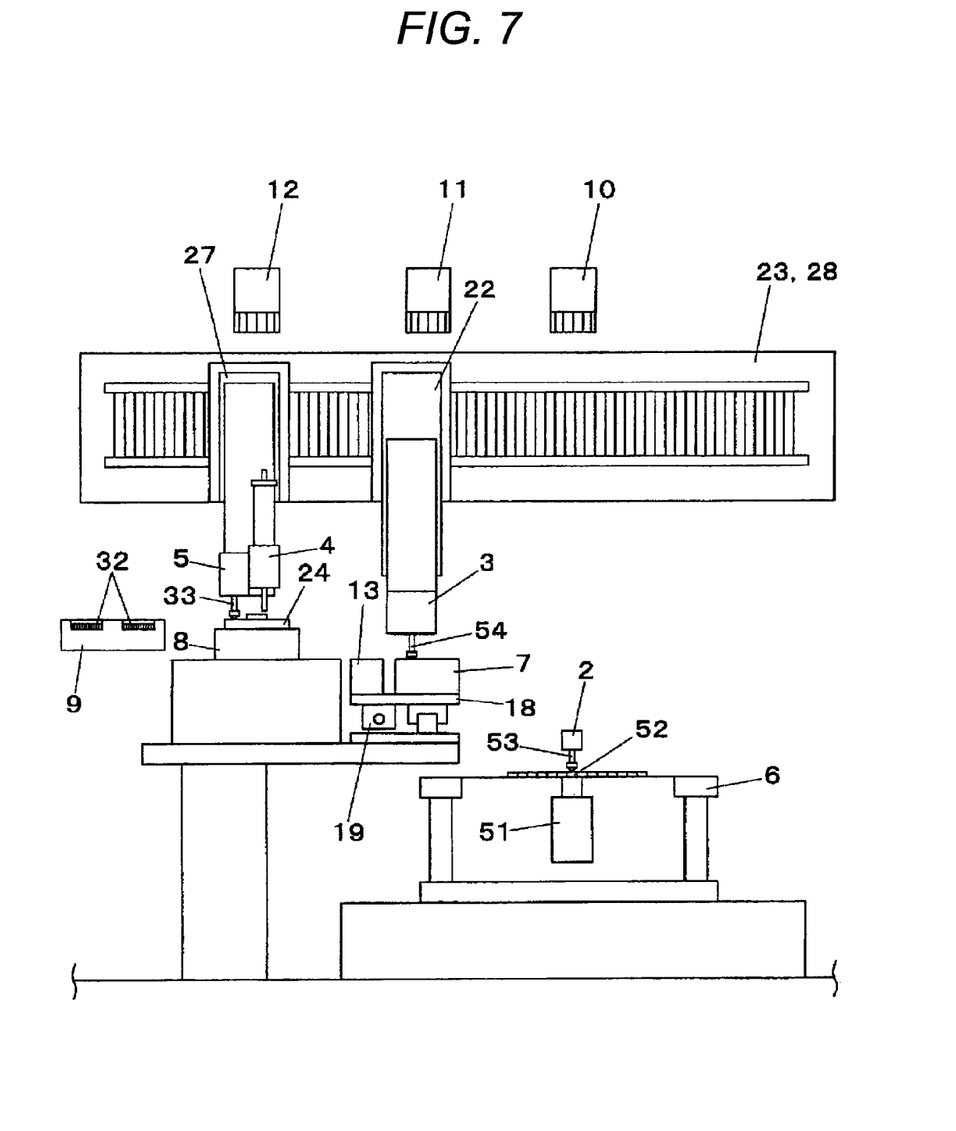
FIG. 7 is an explanatory view of a mounting operation of the electronic parts mounting device in the exemplary embodiment of the present invention.

In FIG. 7, the pick-up head 2 adsorbs the micro chip 52 by receiving the assist of the ejector 51. During that time, the transfer head 5 presses the transfer pin 33 immersed in the paste adhesive material to the board 24 to transfer the paste adhesive material to the board 24. During that time, the bonding head 3 replaces the bonding nozzle 26 by a bonding nozzle 54 for the micro chip 52 to be mounted next.

Figure 8:
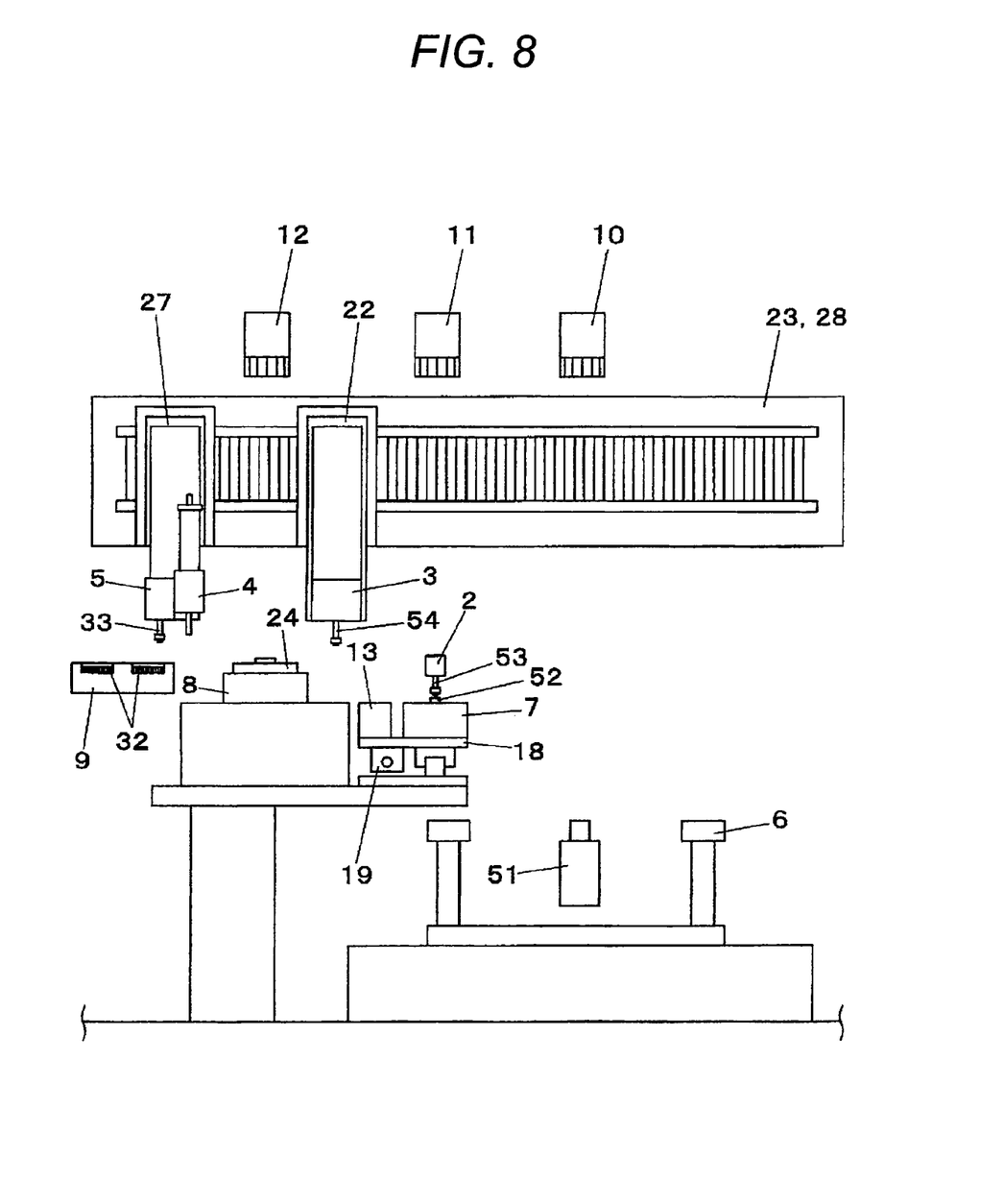
FIG. 8 is an explanatory view of a mounting operation of the electronic parts mounting device in the exemplary embodiment of the present invention.

In FIG. 8, the pick-up head 2 carries the micro chip 52 to the parts relay table 7. The bonding head 3 that finishes the exchange of the bonding nozzle 54 retreats to an upper position to provide an area for an operation by the pick-up head 2. Further, the transfer head 5 that finishes a transfer operation retreats to a side part of the board 24 to provide an area for a bonding operation by the bonding head 3. The microchip 52 is removed from the parts supply table 6 to exchange for a different kind of chip.

Figure 9:
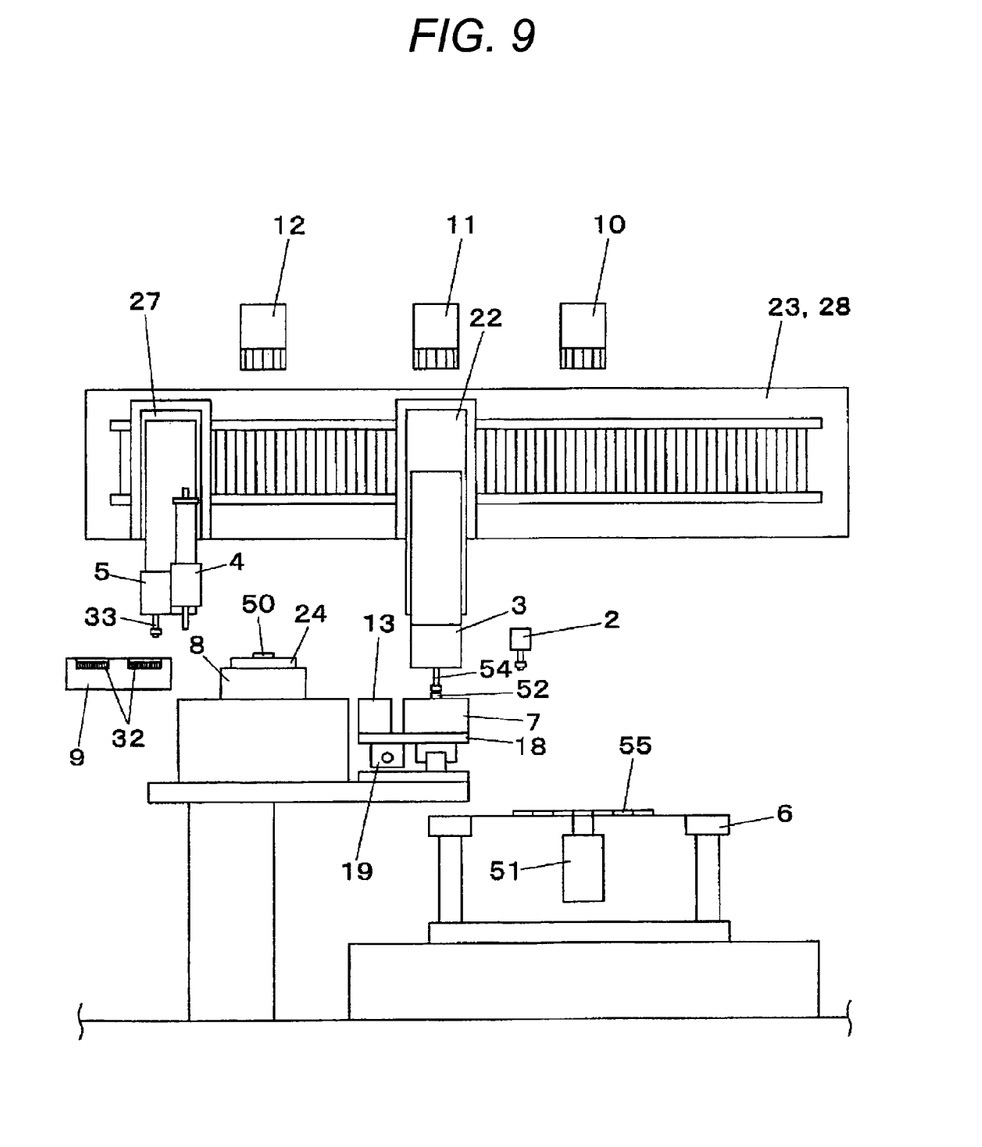
FIG. 9 is an explanatory view of a mounting operation of the electronic parts mounting device in the exemplary embodiment of the present invention.

In FIG. 9, the pick-up head 2 that finishes the operation retreats to the side part of the parts relay table 7 and the bonding head 3 adsorbs the microchip 52 mounted on the parts relay table 7. During that time, in the parts supply table 6, a chip 55 is prepared in place of the microchip 52.

Figure 10:
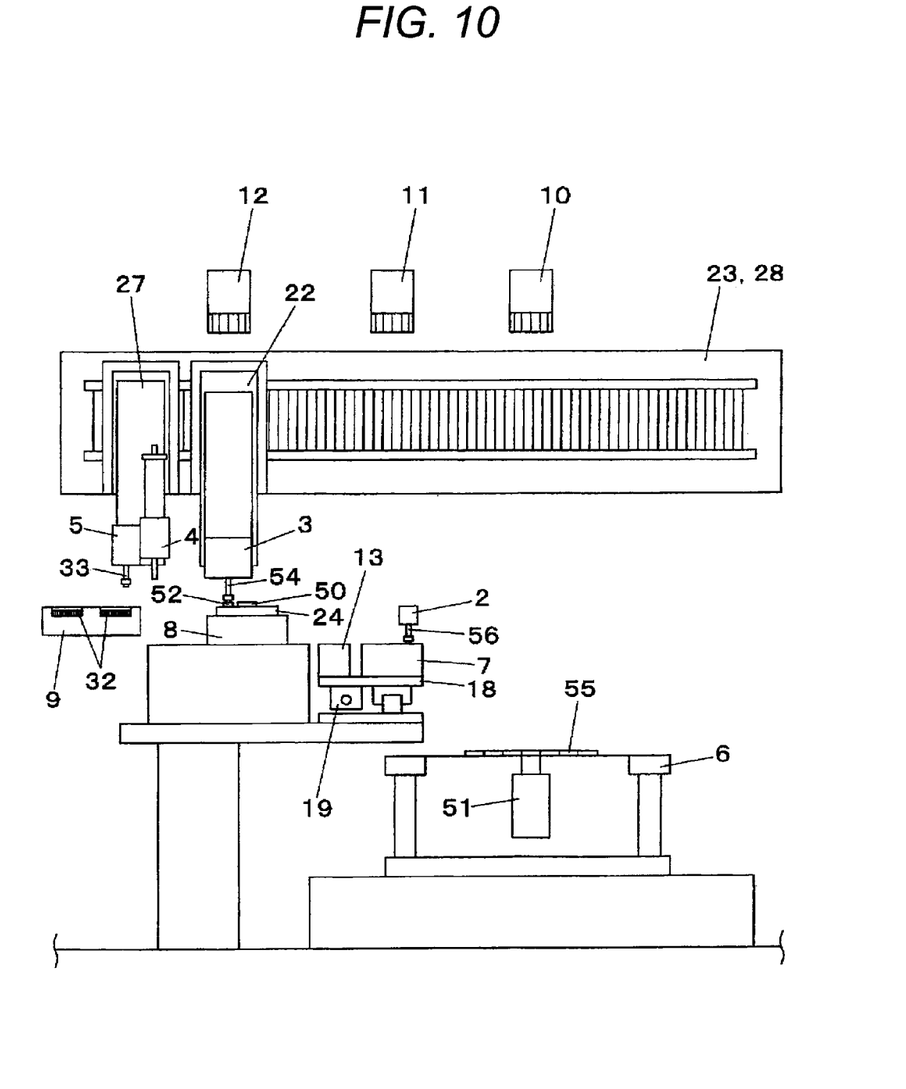
FIG. 10 is an explanatory view of a mounting operation of the electronic parts mounting device in the exemplary embodiment of the present invention.

In FIG. 10, the bonding head 3 mounts the microchip 52 on the board 24. In a part on which the microchip 52 is mounted, the paste adhesive material is transferred to mount the microchip 52 thereon. During that time, the pick-up head 2 replaces the pick-up nozzle 53 by a pick-up nozzle 56 for the chip 55 to be picked up next. The pick-up nozzle 56 is previously stored in the nozzle stocker 20.

Figure 11:
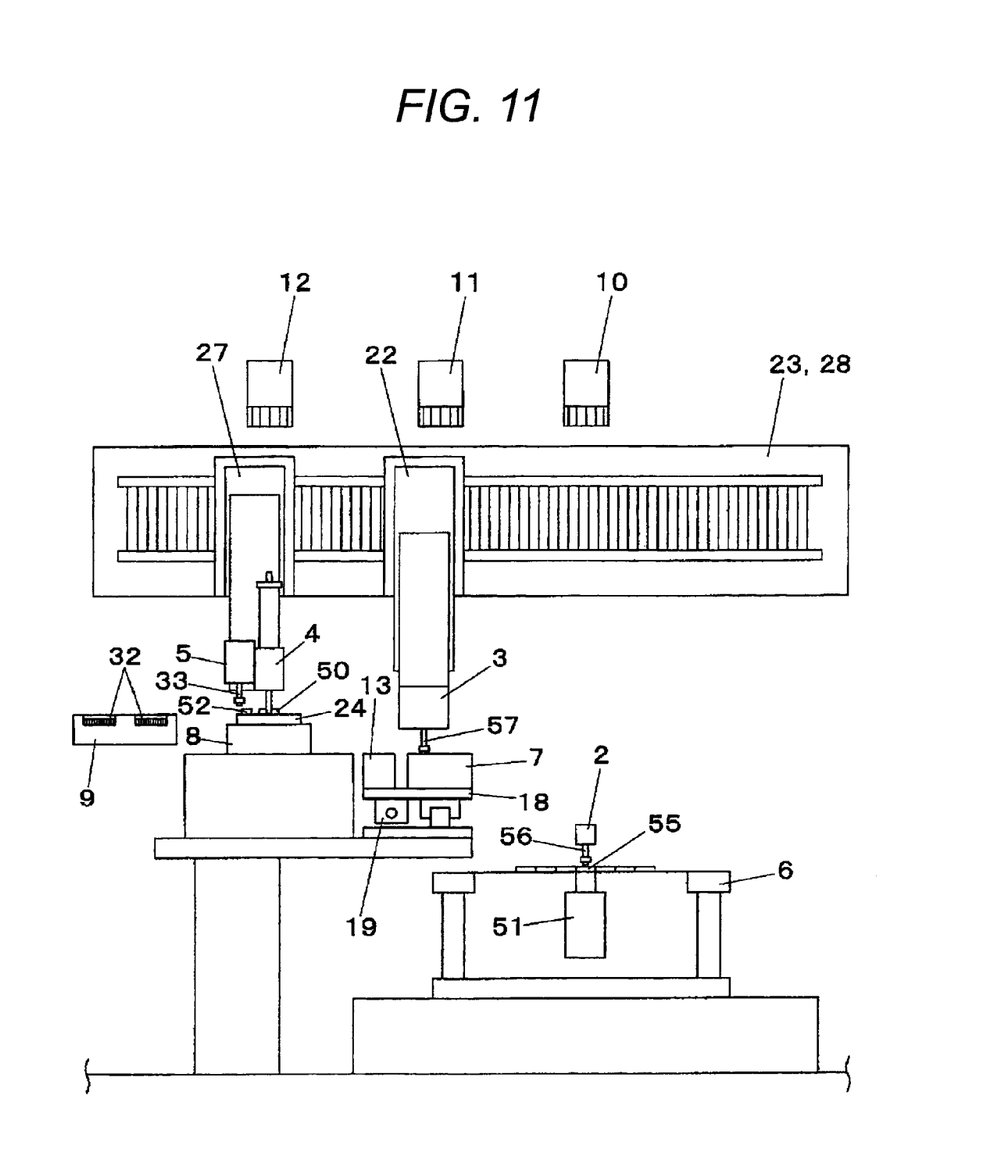
FIG. 11 is an explanatory view of a mounting operation of the electronic parts mounting device in the exemplary embodiment of the present invention.

In FIG. 11, the pick-up head 2 adsorbs the chip 55 by receiving the assist of the ejector 51. During that time, the dispense head 4, a position in the direction of height of which is changed so as to be relatively located at a lower position than the transfer head 5, supplies the paste adhesive material to the board 24. The bonding head 3 replaces the bonding nozzle 54 by a bonding nozzle 57 for the chip 55 to be mounted next.

As described above, in the electronic parts mounting device 1, depending on whether the chip as the object to be mounted is the micro chip or other chip than the micro chip, the nozzles attached to the pick-up head 2 or the bonding head 3 are replaced by the proper nozzles, and either the dispense head 4 or the transfer head 5 is used to supply the paste adhesive material to the board 24. Thus, since the paste adhesive material can be supplied with optimum forms meeting the kinds of the chips, the improvement of the bonding quality of the chip to the board can be anticipated.

In addition to the above-described mounting operations of the electronic parts mounting device 1, when the curvature exceeding a predetermined allowable value occurs in the part of the board 24 on which the chip is mounted, the transfer head 5 may be selected irrespective of the kind of the chip. Since the transfer head 5 presses the transfer pin 33 to the board 24 during a transfer operation, the transfer head 5 can supply the paste adhesive material to a more precise position under a state that the curvature of the board 24 is corrected to some degree. Further, when a detector for detecting the height of the upper surface of the board is used to detect a curvature for each board, the dispense head and the transfer head may be more properly employed.

Since the present invention includes, as the unit that supplies the paste adhesive material for bonding the electronic parts to the board, the transfer head that transfers the paste adhesive material to the board and the dispense head that draws an image by discharging the paste adhesive material to the board, and either the transfer head or the dispense head may be selected depending on the kind of the electronic parts to be mounted, the paste adhesive material can be advantageously supplied in more suitable forms for the kinds of the electronic parts as objects to be mounted. The present invention is available when many kinds of electronic parts are mounted on the board by one electronic parts mounting device.

What is claimed is:

1. An electronic parts mounting method that receives parts supplied from an electronic parts supply part by a moving head and moves the parts to a prescribed position on a board supported by a board support part, the electronic parts mounting method comprising:

a step of receiving the parts from the electronic parts supply part by the moving head;

a step of selecting, depending on the kind of the electronic parts to be mounted or a curvature of the board occurred in the board, an appropriate head from transfer head and an dispense head of a paste supply unit that is located in a side opposed to the electronic parts supply part with the board support part sandwiched between them and includes a paste storing part that stores a paste, the transfer head that transfers the paste from the paste storing part to the board and the dispense head that draws an image by discharging the paste to the board to supply a paste type bonding agent to the board; and a step of moving the parts onto the bonding agent supplied to the board by the moving head or a curvature of the board occurred in the board.

2. The electronic parts mounting method according to claim 1, further comprising determining which of the transfer head or the dispense head is the appropriate head based on the kind of the electronic parts or the curvature of the board.

3. The electronic parts mounting method according to claim 1, wherein the appropriate head is selected based on the size of each of the electronic parts.

* * * * *